(12) United States Patent
Komino et al.

(10) Patent No.: US 7,337,745 B1
(45) Date of Patent: Mar. 4, 2008

(54) ELECTRODE, SUSCEPTOR, PLASMA PROCESSING APPARATUS AND METHOD OF MAKING THE ELECTRODE AND THE SUSCEPTOR

(75) Inventors: Mitsuaki Komino, Tokyo-To (JP); Hideaki Amano, Zama (JP); Shosuke Endo, Nirasaki (JP); Toshiaki Fujisato, Tama (JP); Yasuharu Sasaki, Machida (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/667,777

(22) Filed: Sep. 22, 2000

Related U.S. Application Data

(63) Continuation of application No. PCT/JP00/02228, filed on Apr. 6, 2000.

(30) Foreign Application Priority Data

Apr. 6, 1999 (JP) ................................. 11-099353

(51) Int. Cl.
*C23C 16/509* (2006.01)
*C23F 1/00* (2006.01)
*H01L 21/306* (2006.01)
*C23C 16/46* (2006.01)

(52) U.S. Cl. .............................. 118/723 E; 118/723 R; 118/724; 118/725; 156/345.43; 156/345.45; 156/345.47; 156/345.52

(58) Field of Classification Search ................ 264/618; 204/298.15; 361/234; 156/345, 345.1, 345.25, 156/345.26, 345.27, 345.35, 345.37; 117/105, 117/108, 86, 88, 949, 954; 118/520, 684, 118/698, 704, 715, 719, 722, 723 E, 723 R, 118/723 I, 723 ME, 723 MR, 724, 725, 726, 118/728, 729; 123/142.5 E, 145 A, 145 R, 123/545, 546, 547, 549, 552, 557; 219/448.11, 219/448.12, 448.17, 448.19, 461.1, 462.1, 219/464.1, 504, 505, 541, 544, 548, 553; 261/107, 115, 142; 392/304, 305, 342, 394, 392/401, 416, 418, 422, 441
See application file for complete search history.

(56) References Cited

U.S. PATENT DOCUMENTS 4,404,262 A * 9/1983 Watmough ............... 428/539.5

(Continued)

FOREIGN PATENT DOCUMENTS

| JP | 6-244143 | 9/1994 |
| JP | 08-199363 | 8/1996 |
| JP | 09-069400 | 3/1997 |

(Continued)

OTHER PUBLICATIONS

Computer Translation of Sagusa et al—http://www1.ipdl.jpo.go.jp/PA1/cgi-bin/PA1INDEX provided.*
Introduction to Materials Science for Engineers, J.F. Shackelford; 3rd Ed. 1992, Macmillan Publishing Co. pp. 460-461.*
http://www.matweb.com.*

*Primary Examiner*—Rudy Zervigon
(74) *Attorney, Agent, or Firm*—Finnegan, Henderson, Farabow, Garrett & Dunner, L.L.P.

(57) ABSTRACT

A susceptor 24 includes a heater 38 disposed in a planar state, upper and lower ceramic-metal composites 40A and 40B disposed so as to sandwich the heater 38 from above and from below, and a ceramic electrostatic chuck 28 for attracting and holding an object to be treated, W. The electrostatic chuck is joined to an upper surface of the upper ceramic-metal composite 40A. The electrostatic chuck 28 has nearly the same coefficient of linear thermal expansion as that of the upper ceramic-metal composite 40A. Thus, peeling or cracking of the electrostatic chuck 28 due to the difference in thermal expansion and contraction between the electrostatic chuck 28 and the upper ceramic-metal composite 40A can be prevented.

7 Claims, 6 Drawing Sheets

U.S. PATENT DOCUMENTS

| | | | | |
|---|---|---|---|---|
| 5,310,453 A | * | 5/1994 | Fukasawa et al. | 438/716 |
| 5,571,366 A | * | 11/1996 | Ishii et al. | 156/345 |
| 5,600,530 A | * | 2/1997 | Smith | 361/234 |
| 5,665,260 A | | 9/1997 | Kawada et al. | 219/467.1 |
| 5,684,669 A | * | 11/1997 | Collins et al. | 361/234 |
| 5,735,993 A | | 4/1998 | Yoshida | 156/345.37 |
| 5,755,886 A | * | 5/1998 | Wang et al. | 118/715 |
| 5,800,618 A | * | 9/1998 | Niori et al. | 118/723 E |
| 5,835,334 A | * | 11/1998 | McMillin et al. | 361/234 |
| 6,101,969 A | * | 8/2000 | Niori et al. | 118/723 E |
| 6,120,661 A | * | 9/2000 | Hirano et al. | 204/298.15 |
| 6,197,246 B1 | * | 3/2001 | Niori et al. | 264/618 |

FOREIGN PATENT DOCUMENTS

| | | |
|---|---|---|
| JP | 9-97783 | 4/1997 |
| JP | 9-165681 | 6/1997 |
| JP | 09-205134 | 8/1997 |
| JP | 9-260474 | 10/1997 |
| JP | 10-321354 | 12/1998 |
| JP | 2000-5884 | 1/2000 |
| JP | 2000-005884 | 1/2000 |

* cited by examiner

F I G. I

ELECTRODE, SUSCEPTOR, PLASMA PROCESSING APPARATUS AND METHOD OF MAKING THE ELECTRODE AND THE SUSCEPTOR

This application is a Continuation of PCT International Application No. PCT/JP00/02228, filed on Apr. 6, 2000, and claims the priority of Japanese patent application Ser. No. 11/99353, filed on Apr. 6, 1999, the content of which is incorporated herein by reference.

TECHNICAL FIELD

This invention relates to an electrode, susceptor and a plasma processing apparatus, and methods of making the electrode and the susceptor.

BACKGROUND OF THE INVENTION

Generally, a plasma processing apparatus is known as a single wafer process apparatus for applying a predetermined treatment, such as etching, CVD (chemical vapor deposition), or sputtering, to a semiconductor wafer.

In this type of plasma processing apparatus, various treatments are applied to a semiconductor wafer at a relatively high temperature, with the semiconductor wafer being placed on a susceptor in a processing vessel in which a vacuum can be produced. During any of the treatments, it is necessary to maintain the wafer so that its position does not deviate. For this purpose, an electrostatic chuck is generally used.

A conventional general plasma processing apparatus will be described. FIG. 11 is a schematic configurational view showing a conventional and general plasma processing apparatus. In a processing vessel 2 that can be sucked, a susceptor 4 concurrently serving as a lower electrode is mounted. The susceptor 4 has a heater 6, such as a sheath heater, buried therein in an insulated state. Concretely, the heater 6 is cast, for example, in aluminum, and buried therein. Onto an upper surface of the susceptor 4 made of aluminum, a ceramic electrostatic chuck 8 is joined by means of an adhesive, the electrostatic chuck 8 comprising a chuck electrode buried in a ceramic material, the chuck electrode for use in electrostatic chucking. A semiconductor wafer W is attracted to and held on an upper surface of the electrostatic chuck 8 by an electrostatic force.

In a ceiling portion of the processing vessel 2, an upper electrode 10 is provided to face the susceptor 4. In the upper electrode 10, a heater 12, such as a sheath heater, is cast in aluminum or the like, and buried therein. Connected to the upper electrode 10 is a high frequency power source 14 for applying a high frequency voltage for plasma generation. A plasma is generated between the upper electrode 10 and the susceptor 4 as a lower electrode to perform a predetermined treatment for the wafer W.

When the treating temperature for the semiconductor wafer is relatively low, e.g., about 200° C. or lower, no particular problem occurs. However, raising the treatment temperature, for example, to about 300 to 400° C. is demanded in order to increase the treating rate, such as film deposition rate, or to improve the quality of the resulting film.

For example, in connection with the upper electrode 10, in such a high temperature region, the amount of thermal expansion and contraction due to a temperature rise and a temperature fall during treatment, or thermal stress is considerably great. Thus, warpage or deflection may occur in the electrode itself, posing the problem of making high frequency propagation for plasma generation nonuniform. A shower head for gas supply may be attached, in close contact, to a lower surface of the upper electrode 10. For the reasons stated above, cracking may occur in the shower head.

In connection with the susceptor 4, the electrostatic chuck 8 may peel off because of heat exceeding the limits of heat resistance of the adhesive, or warpage or deflection may occur in accordance with the occurrence of thermal expansion and contraction, or thermal stress stated above. Besides, the problem may arise that the electrostatic chuck 8 itself cracks owing to the difference in the coefficient of linear thermal expansion between the aluminum constituting the susceptor 4 and the ceramic constituting the electrostatic chuck 8.

Particularly as the wafer size increases from 6 inches to 8 inches, further to 12 inches, the amount of thermal expansion and contraction becomes large correspondingly. Thus, early solutions to the above-described problems are desired.

DISCLOSURE OF THE INVENTION

The present invention has been made in view of the above problems and as effective solutions to these problems. A first object of the present invention is to suppress the occurrence of warpage or deflection of an electrode.

A second object of the present invention is to provide a susceptor which causes no peeling or cracking to an electrostatic chuck.

To achieve the first object, an electrode according to the present invention is formed by casting a heater and ceramic-metal composites in a base metal, the heater being disposed in a planar state, and the ceramic-metal composites being disposed so as to sandwich the heater from above and from below. The ceramic-metal composites reinforce the electrode, thus suppressing the occurrence of warpage or deflection.

The electrode according to the present invention is formed by casting a heater and a core metal plate in a base metal, the heater being disposed in a planar state, and the core metal plate being provided nearly parallel to a plane of disposition of the heater and side by side with respect to the heater. Thus, the electrode is reinforced with the core metal plate, so that the occurrence of warpage or deflection can be suppressed. In the core metal plate, a plurality of base metal communication holes are preferably formed. By so doing, the base metal can be bound via the base metal communication holes, whereby the strength of the entire electrode can be further improved.

For the electrode, a shower head portion for gas supply may be attached to a lower surface of the base metal. In this case, too, warpage or deflection minimally occurs in the electrode itself as stated above. Thus, cracking or peeling of the shower head portion can be prevented.

A high frequency voltage can be applied to the electrode. In this case, distortion of the electrode is suppressed, so that a high frequency wave can be propagated uniformly.

To attain the second object, the present invention provides a susceptor including a heater disposed in a planar state, upper and lower ceramic-metal composites disposed so as to sandwich the heater from above and from below, and a ceramic electrostatic chuck for attracting and holding an object to be treated, the electrostatic chuck having nearly the same coefficient of linear thermal expansion as that of the upper ceramic-metal composite, and being joined to an upper surface of the upper ceramic-metal composite. According to this feature, the entire susceptor is reinforced with the upper and lower ceramic-metal composites to suppress warpage or deflection. Besides, the coefficient of linear thermal expansion of the upper ceramic-metal composite and that of the electrostatic chuck are set to be nearly the same. Thus, little difference arises between the amounts of thermal expansion and contraction of the upper ceramic-metal composite and the electrostatic chuck. Consequently, peeling or cracking of the electrostatic chuck can be prevented.

The heater and the upper and lower ceramic-metal composites are preferably cast in a base metal.

It is also preferred to constitute the susceptor such that a heat transfer gas can be supplied to a rear surface of the object to be treated which has been placed on the electrostatic chuck.

The upper ceramic-metal composite and the electrostatic chuck can be joined together by methods, such as brazing, forge-welding, or adhesion.

A high frequency voltage can be applied to the susceptor. In this case, distortion of the susceptor is suppressed, so that a high frequency wave can be propagated uniformly.

A plasma processing apparatus can be constituted with the use of electrodes and/or a susceptor having the above-described features. In this case, deformation of the electrodes or susceptor due to thermal expansion and contraction can be suppressed. Thus, treatment with high plane uniformity can be performed stably even during high temperature treatment.

It is preferred to produce the electrode and/or the susceptor by placing a heater and a porous ceramic in a mold, and pouring a molten base metal into the mold to cast the porous ceramic and the heater in the base metal. According to this manufacturing method, the porous ceramic is infiltrated with the base metal during the casting process to form a ceramic-metal composite. This results in the formation of a metal phase in which the metal surrounding the heater and the metal constituting the ceramic-metal composite continue, thus making it possible to improve the strength of the electrode or susceptor.

DESCRIPTION OF THE PREFERRED EMBODIMENTS

An embodiment of an electrode, a susceptor, a plasma processing apparatus, and methods for producing them, which are related to the present invention, will be described in detail based on the accompanying drawings.

Figure 1:
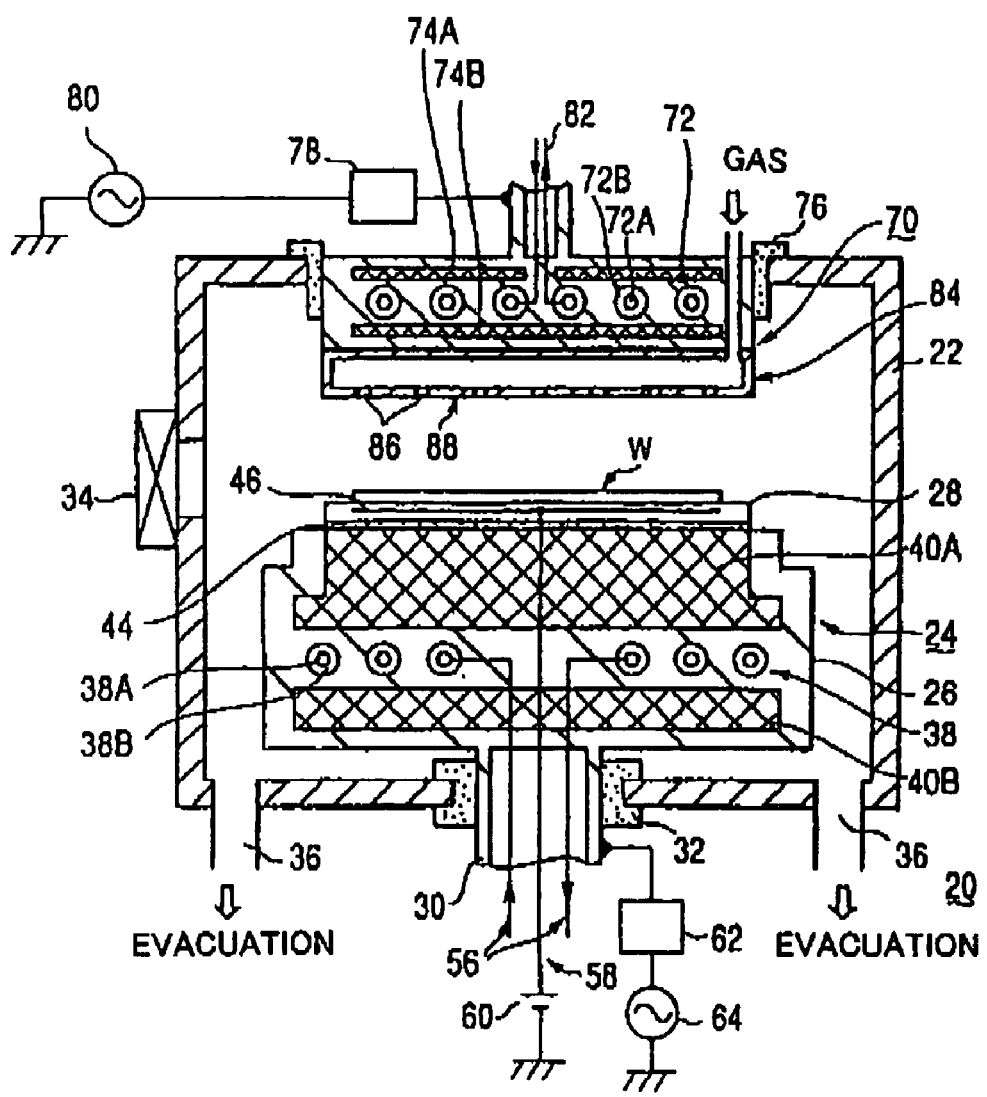
FIG. 1 is a configurational view showing a plasma processing apparatus as an embodiment of the invention.
Figure 2:
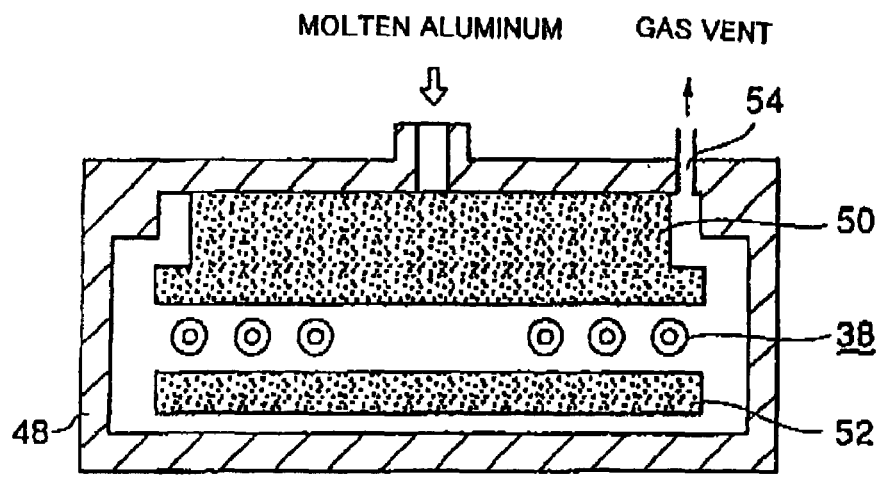
FIG. 2 is an explanation drawing for illustrating a method for producing an upper electrode in FIG. 1.
Figure 3:
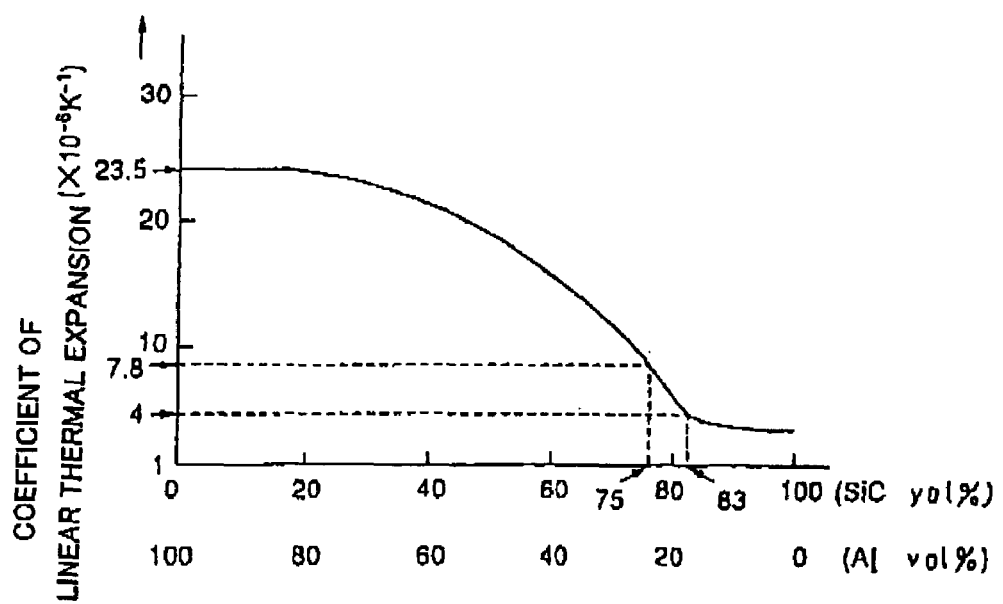
FIG. 3 is a graph showing the relationship between the contents (volume percentages) of SiC and Al in an Al—SiC composite and the coefficient of linear thermal expansion of the composite.

FIG. 1 is a configurational view showing a plasma processing apparatus as an embodiment of the invention. FIG. 2 is an explanation drawing for illustrating a method for producing an upper electrode in FIG. 1. FIG. 3 is a graph showing the relationship between the content of SiC in aluminum and the coefficient of linear thermal expansion.

As shown in FIG. 1, a plasma processing apparatus 20 has a cylindrical processing vessel 22, for example, made of aluminum. Provided at a side portion of the processing vessel is a gate valve 34, which is opened and closed when a semiconductor wafer W, i.e., an object to be treated, is carried into and out of the processing vessel 22. Provided at the bottom of the processing vessel 22 is an exhaust port 36, which is connected to an evacuation system having a vacuum pump or the like (not shown) interposed therein. Thus, the interior of the processing vessel 22 can be sucked.

Provided in the processing vessel 22 is a susceptor 24, on which the semiconductor wafer W as the object to be treated is placed and held thereby. The susceptor 24 concurrently serves as a lower electrode. The susceptor 24 comprises a susceptor body 26, and an electrostatic chuck 28 joined to an upper surface of the body 26. A support member 30 extends downward from a lower portion of the susceptor body 26, and passes through the bottom of the processing vessel 22 via an insulating member 32. The support member 30 supports the whole of the susceptor 24.

Buried in the susceptor body 26 is a planar lower heater 38, which comprises a sheath heater with a diameter of about 10 mm wound in a spiral form. The lower heater 38 is composed of a heating element 38A as a core member formed of nickel-chromium alloy, and an insulator 38B surrounding the center and formed of magnesia ($Mg_2O_3$).

An upper ceramic-metal composite 40A and a lower ceramic-metal composite 40B, for the susceptor 24, are disposed so as to sandwich the heater 38 from above and from below. The composites 40A, 40B and the heater 38 are entirely covered with a pure aluminum metal. Each of the ceramic-metal composites 40A, 40B are a composite of a metal such as aluminum, and a ceramic such as SiC (silicon carbide), AlN (aluminum nitride), or $Al_2O_3$ (alumina). In this case, the ceramic-metal composites 40A, 40B are set at desired coefficients of linear thermal expansion in a certain range by selecting the mixing ratio between aluminum and ceramic.

An upper surface of the upper ceramic-metal composite 40A is exposed without being covered with aluminum. Joined onto this upper surface is the ceramic electrostatic chuck 28 for attracting and holding the semiconductor wafer W, by means of an aluminum brazing material having excellent heat resistance. In this case, a plate-like, foil-like, pasty or powdery brazing material may be used. The electrostatic chuck 28 is formed by burying a chuck electrode 46 in a ceramic material. The ceramic material may be SiC, AlN or $Al_2O_3$.

Here, it is important that the coefficient of linear thermal expansion of the electrostatic chuck 28 and the coefficient of linear thermal expansion of the upper ceramic-metal composite 40A for the susceptor are set to be substantially the same in order to reduce the difference in the amounts of thermal expansion and contraction between them.

When AlN is used as the ceramic material for the electrostatic chuck 28, and an Al—SiC composite is used as the ceramic-metal composite 40A for example, the coefficient of linear thermal expansion of the upper ceramic-metal composite 40A is set at about $4.5 \times 10^{-6}$ $K^{-1}$, because the coefficient of linear thermal expansion of AlN is about $4.5 \times 10^{-6}$ $K^{-1}$.

Concretely, the coefficient of linear thermal expansion of Al is about $23.5 \times 10^{-6}$ $K^{-1}$, while the coefficient of linear thermal expansion of SiC is about $3.5 \times 10^{-6}$ $K^{-1}$. Thus, the coefficient of linear thermal expansion of the Al—SiC composite varies as shown in FIG. 3 in accordance with the mixing ratio between the two. To make the coefficient of linear thermal expansion of the composite about $4.5 \times 10^{-6}$ $K^{-1}$, the content (volume percentage) of SiC is set at about 83%. By using such a composite, the coefficient of linear thermal expansion of the electrostatic chuck 28 of AlN and the coefficient of linear thermal expansion of the upper ceramic-metal composite 40A of Al—SiC are set to be substantially the same. The coefficient of linear thermal expansion of the lower ceramic-metal composite 40B may also be set at substantially the same value as described above.

Another example is the use of $Al_2O_3$ having a coefficient of linear thermal expansion of about $7.8 \times 10^{-6} K^{-1}$ as the ceramic material for the electrostatic chuck 28. In this case, the upper ceramic-metal composite 40A having the same coefficient of linear thermal expansion of about $7.8 \times 10^{-6} K^{-1}$ can be selected by using an Al—SiC composite with an SiC content (volume percentage) of about 75%, based on the graph shown in FIG. 3.

The above-described ceramic-metal composites 40A, 40B having a coefficient of linear thermal expansion of $4.5 \times 10^{-6} K^{-1}$ can be produced in the following manner: In a mold 48 having a predetermined internal shape as shown, for example, in FIG. 2, a wound lower heater 38, and two porous SiC blocks (porous ceramic) 50 and 52 having a predetermined porosity (a porosity of nearly 17% herein) are fixed by support members (not shown). Then, molten aluminum as a base metal is poured into the mold 48 to infiltrate the porous SiC blocks 50, 52 with molten aluminum. The numeral 54 denotes a vent hole. In this manner, the ceramic composites 40A, 40B can be formed, and at the same time, these composites and the lower heater 38 can be cast in aluminum and integrated.

To obtain a ceramic-metal composite having a coefficient of linear thermal expansion of $7.8 \times 10^{-6} K^{-1}$, two porous blocks having a porosity of about 25% may be used. When alumina is used as a ceramic material, fiberous alumina may be used. In this case fiberous alumina is set in the mold 48 instead of the porous blocks 50, 52.

For aluminum infiltration, high pressure casting process or forging cast process may be used in which the interior of the mold 48 is pressurized during molding to promote infiltration of Al into the preformed ceramic, while bubbles remaining in the mold 48 can be easily released to the outside. Vacuum assist casting process in which the interior of the mold 48 is reduced in pressure to promote infiltration of Al into the ceramic as a preform.

Returning to FIG. 1, the lower heater 38 of the susceptor 24 constituted as described above is supplied with an electric power via a lead wire 56. A direct current voltage source 60 is connected to the chuck electrode 46 of the electrostatic chuck 28 via a lead wire 58, whereby an attracting force for attraction of the wafer is generated.

A bias high frequency power source 64 is connected to the susceptor 24 via a matching circuit 62 to suppress generation of an ion sheath on the surface of the susceptor 24 during plasma treatment. The bias high frequency power source 64 may be provided where necessary.

At a ceiling portion of the processing vessel opposed to the susceptor 24, an upper electrode 70 is provided. Concretely, the upper electrode 70 has an internal structure that is substantially the same as the susceptor 24 as the lower electrode. In the upper electrode 70, a planar upper heater 72 is buried. The upper heater 72 comprises, for example, a sheath heater with a diameter of about 10 mm wound in a spiral form. The upper heater 72 is also composed of a heating element 72A comprising, for example, a nickel-chromium alloy as the core, and an insulator 72B comprising, for example, magnesia ($Mg_2O_3$) and surrounding the core.

An upper ceramic-metal composite 74A and a lower ceramic-metal composite 74B, each about 5 to 10 mm thick and used for the upper electrode, are disposed so as to sandwich the heater 72 from above and from below. The composites 74A, 74B and the heater 72 are entirely covered with a pure aluminum metal.

These ceramic-metal composites 74A, 74B, like the aforementioned composites 40A, 40B, are each a composite of a metal such as aluminum, and a ceramic such as SiC, AlN, or $Al_1O_3$. The method of making these ceramic-metal composites 74A, 74B may be an infiltration process as illustrated earlier in FIG. 2. The upper heater 72 can be fed a heating electric power via a lead wire 82.

The upper electrode 70 is attached to and supported by the ceiling portion of the vessel via an insulating member 76. To the upper electrode 70, a plasma generation high frequency power source 80 for generating a high frequency wave of, for example, 13.56 MHz is connected via a matching circuit 78.

To a lower portion of the upper electrode 70, a shower head portion 84 made of, for example, aluminum is joined by means of a screw or the like (not shown). A lower surface of the shower head portion 84 is formed as a gas jet surface 88 made of silicone having many gas holes 86 to be capable of supplying a predetermined gas toward a treatment space through the gas holes 6.

Next, the actions of the present embodiment constituted as described above will be explained.

An untreated semiconductor wafer W supported by a carrier arm (not shown) is carried into the processing vessel 22 via the opened gate valve 34, and placed on the susceptor 24. This wafer W is attracted and held by an attraction force of the electrostatic chuck 28 which is generated by turning on the direct current voltage source 60.

Then, the wafer W is heated to a predetermined process temperature by the upper heater 72 of the upper electrode 70 and the lower heater 38 of the susceptor 24. Film forming gases, such as $SiH_4$, $SiF_4$, and oxygen, are introduced into the treatment space at a controlled flow rate through the gas holes 86 of the shower head portion 84 provided on the lower surface of the upper electrode 70. The interior of the processing vessel 22 is maintained at a predetermined process pressure, a plasma generation high frequency voltage of 13.56 MHz is applied to the upper electrode 70, and a bias high frequency voltage is applied to the susceptor 24.

Upon application of the plasma generation high frequency voltage to the upper electrode 70, the film forming gases are converted into a plasma, activated, and reacted to form a film of, for example, SiOF on the surface of the waver.

The process temperature is in a high temperature region of about 300 to 400° C., which is higher than the conventional process temperature. Thus, repetition of the process results in great repetitive thermal stress imposed on the upper electrode 70 and the susceptor 24.

In this case, in connection with the upper electrode 70, the upper heater 72 is cast by the upper and lower ceramic-metal composites 74A and 74B disposed so as to sandwich the upper heater 72. Thus, the entire strength of the upper electrode 70 is increased, so that warpage or deflection of the upper electrode 70 can be prevented. Particularly, the two composites 74A and 74B are buried in such a manner as to sandwich the heater 72. Thus, they thermally expand and contract in comparable sizes. Hence, great thermal stress is not imposed in the thickness direction of the upper electrode 70. In this respect, the occurrence of warpage or deflection can be markedly suppressed.

Accordingly, nonuniformity of high frequency propagation attributed to the distortion of the upper electrode 70 can be eliminated. Not only uniform plasma can be generated, but also cracking of the shower head portion 84 can be prevented.

In connection with the susceptor 24, on the other hand, the lower heater 38 is sandwiched from above and below by the upper and lower ceramic-metal composites 40A and 40B for the susceptor. Thus, the strength of the susceptor 24 itself can be increased. As a result, warpage or deformation can be prevented, even if thermal stress associated with thermal expansion and contraction occurs. Particularly, the coefficient of linear thermal expansion of the ceramic electrostatic chuck 28 and that of the upper ceramic-metal composite 40A bonded there to are set to be nearly the same. Thus, even if the chuck 28 and the composite 40A thermally expand and contract in accordance with a temperature rise and a temperature fall, their amounts of thermal expansion and contraction are nearly the same. Hence, great thermal stress can be pr vented from working between the two. Consequently, cracking or peeling of the electrostatic chuck 28 can be prevented.

Also, the electrostatic chuck 28 is bonded to the surface of the upper ceramic-metal composite 40A by use of a brazing agent having high resistance to heat. Thus, the electrostatic chuck 28 can withstand a high temperature treatment of about 300 to 400° C. In this respect as well, peeling of the electrostatic chuck 28 can be prevented.

The susceptor 24 and the upper electrode 70, each having the ceramic-metal composites buried inside, can be produced at a stroke, including the heater, by the infiltration method, as illustrated in FIG. 2. Thus, they can be produced conveniently and easily, with a small number of steps.

Figure 4:
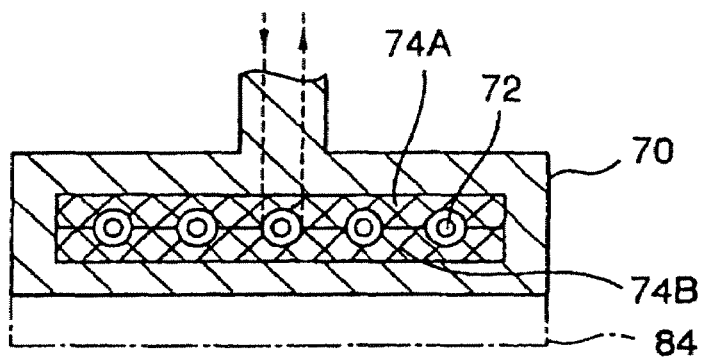
FIG. 4 is a schematic sectional view showing a modified example of an electrode according to the present invention.

In the above-described embodiment, the upper heater 72 is buried between the upper and lower ceramic-metal composites 74A and 74B in the upper electrode 70, with the upper and lower ceramic-metal composites 74A and 74B being separated from each other by a distance slightly larger than the diameter of the upper heater 72. However, the mode of burial is not restricted to this mode. As shown in FIG. 4, both composites 74A and 74B may be joined together, and the upper heater 72 may be completely buried in the laminated composites. In this case, Al practically does not exist alone between both composites 74A and 74B. As a result, the occurrence of thermal stress at this site can be suppressed more reliably, so that warpage or deflection at this site can be further suppressed.

Figure 5:
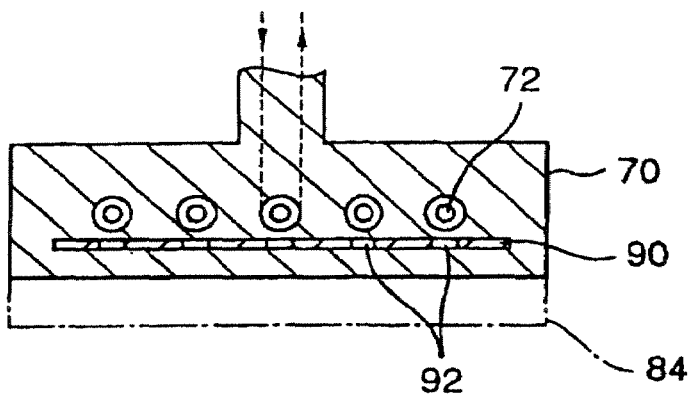
FIG. 5 is a schematic sectional view showing another example of the electrode according to the present invention.
Figure 6:
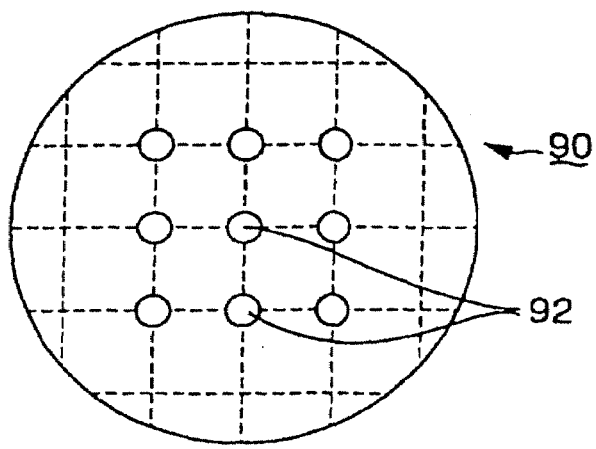
FIG. 6 is a plan view showing a core metal plate.

Furthermore, a very thin, highly rigid, disk-shaped core metal plate 90 about 1 to 2 mm thick may be buried parallel to the upper heater 72, as shown in FIGS. 5 and 6, without providing any of the composites 74A and 74B in the upper electrode 70. FIG. 6 is a plan view of the core metal plate 90. As this core metal plate 90, a metal plate of, for example, stainless steel having a higher softening point (temperature) and higher rigidity than aluminum as the base metal, is used. In the core metal plate 90, many base metal communication holes 92 with a diameter of about 0.1 to 10 mm are formed therethrough. Thus, when the core metal plate 90 is cast in aluminum, aluminum above and aluminum below the core metal plate 90 are bound together through the communication holes 92.

In the case of this embodiment as well, the upper electrode 70 is reinforced with the core metal plate 90, so that the occurrence of warpage or deflection can be suppressed.

Besides, the coefficient of linear thermal expansion of the core metal plate 90 and that of aluminum as the base metal are different. Thus, the interface between the core metal plate 90 and the base metal may peel off. However, the aluminum above and the aluminum below the core metal plate 90 are bound together through the base metal communication holes 92, and the core metal plate 90 is so thin that the influence of its thermal expansion and contraction is minimal. Therefore, the interface between the core metal plate 90 and the aluminum as the base metal does not peel off. Moreover, the core metal plate 90 has satisfactory heat conductivity, and thus the upper electrode 70 can be heated promptly.

Furthermore, two of the core metal plates 90 may be provided above and below the upper heater 72 so as to sandwich it. According to this feature, the difference in thermal expansion and contraction between the upper side and the lower side of the upper electrode 70 can be decreased, whereby the resulting thermal stress can be further suppressed.

Figure 7:
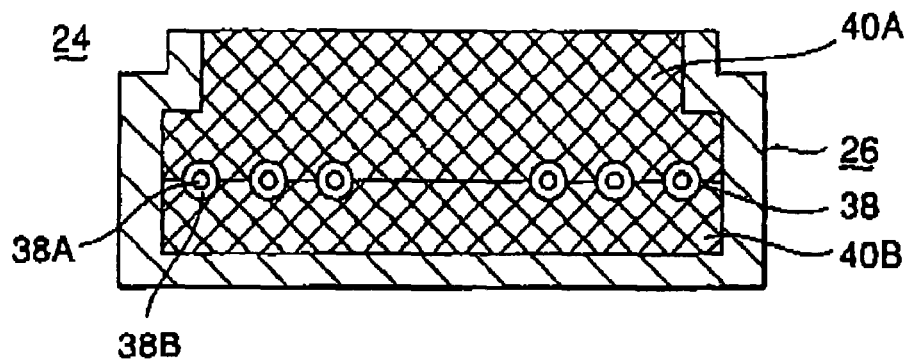
FIG. 7 is a schematic sectional view showing a modified example of a susceptor according to the present invention.

In the susceptor 24 of the aforementioned embodiment, the lower heater 38 is buried between the upper and lower ceramic-metal composites 40A and 40B, with the upper and lower ceramic-metal composites 40A and 40B being separated from each other by a distance slightly larger than the diameter of the lower heater 38. However, the mode of burial is not restricted to this mode. As shown in FIG. 7, both composites 40A and 40B may be joined together, and the lower heater 38 may be completely buried in the laminated composites.

In this case, Al practically does not exist alone between both composites 40A and 40B. As a result, the occurrence of thermal stress at this sit can be suppressed more reliably, so that warpage or deformation at this site can be further suppressed. As a brazing agent for joining together the upper ceramic-metal composite 74A and the ceramic electrostatic chuck 28, an AlSi type, an AlsiGe type, an AlSiMg type or an AlSiGeMg type can be used as well as Aluminum. A brazing agent containing Ge or Mg, in particular, can improve the wettability of the surface, thus further improving the strength of the joint between the composite and the chuck.

Figure 8:
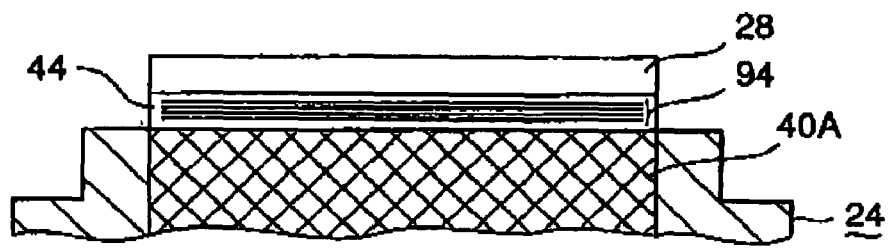
FIG. 8 is a view showing a modified example of joining of an electrostatic chuck of the susceptor.

Furthermore, brazing may be performed using a cladding layer 94 about 1 to 2 mm thick as shown in FIG. 8. In this case, the cladding layer 94 comprising many, very thin cladding films about 10 to 100 μm thick may be used. When an AlSiGeMg brazing agent consisting mainly of an aluminum metal, for example, it is advisable to interpose an aluminum film in the center of the cladding layer 94, and form cladding films having gradually varied mixing ratios of Al and Si with the same tendency toward both sides of the cladding layer 94 to impart a gradient to the coefficient of linear thermal expansion. Further, the coefficients of linear thermal expansion of the upper and lower outermost cladding films may be made nearly consistent with the coefficient of linear thermal expansion of the ceramic electrostatic chuck 28 (upper ceramic-metal composite 40A). According to this feature, effect of the thermal expansion and contraction of the cladding layer 94 can be absorbed. In this case as well, the electrostatic chuck 28 and the composite 40A can be bound together firmly without deterioration in the bond strength between them.

Figure 9:
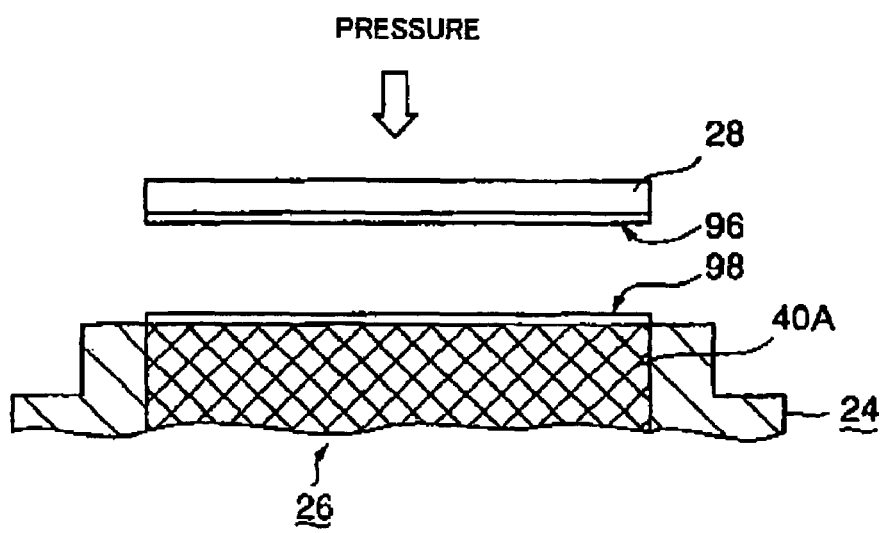
FIG. 9 is a view showing another modified example of joining of the electrostatic chuck of the susceptor.

The above-described joining between them is not restricted to the foregoing brazing, and may be achieved by forge-welding (the technique of partially pressurizing members, which require joining, from above their outer peripheral portions to apply local compression, and causing a metal flow to the outer peripheral portions to carry out bonding). According to this forge welding, as shown in FIG. 9, the following steps, for example, are taken: Active aluminum layers 96 and 98 are deposited by sputtering on a lower surface of the electrostatic chuck 28 and an upper surface of the upper ceramic-metal composite 40A of the susceptor body 26 in a vacuum vessel. In this state, both are pressure welded for bonding.

As another method, the active aluminum layers 96 and 98 are deposited, for example, by thermal spraying in the air. In this case, the aluminum surface immediately oxidizes, and its activity declines. Then, thin oxide films spontaneously formed on the surfaces of the active aluminum layers 96 and 98 are removed in a vacuum vessel to expose the active surfaces. In this state, both surfaces are pressure welded.

When forge-welding is carried out in this manner, only aluminum is used, unlike a brazing agent containing various metals. Thus, contamination of the wafer with heavy metals can be prevented.

If an adhesive has a heat-resistant temperature compatible with the process temperature of the plasma processing apparatus, the electrostatic chuck 28 and the upper ceramic-metal composite 40A may be joined together with the use of the adhesive. The adhesive may be a resin adhesive, such as a silicone adhesive or an epoxy adhesive, or a ceramic adhesive. Preferably, the adhesive having high thermal conductivity is used.

In the above-described embodiment, an electric heater utilizing resistance heating is sued as the heater, but the heater is not restricted thereto. For example, the heater may be composed of a tube capable of passing a heating medium. In this case, the tube can be easily buried inside the susceptor or the electrode by casting.

Figure 10A:
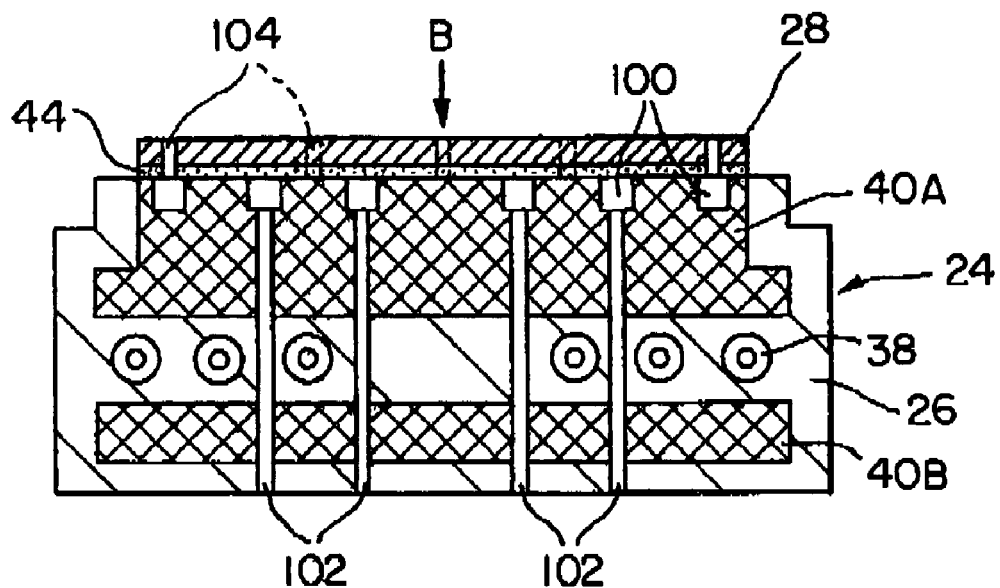
FIGS. 10($a$) and 10($b$) are views showing another example of the susceptor.
Figure 10B:
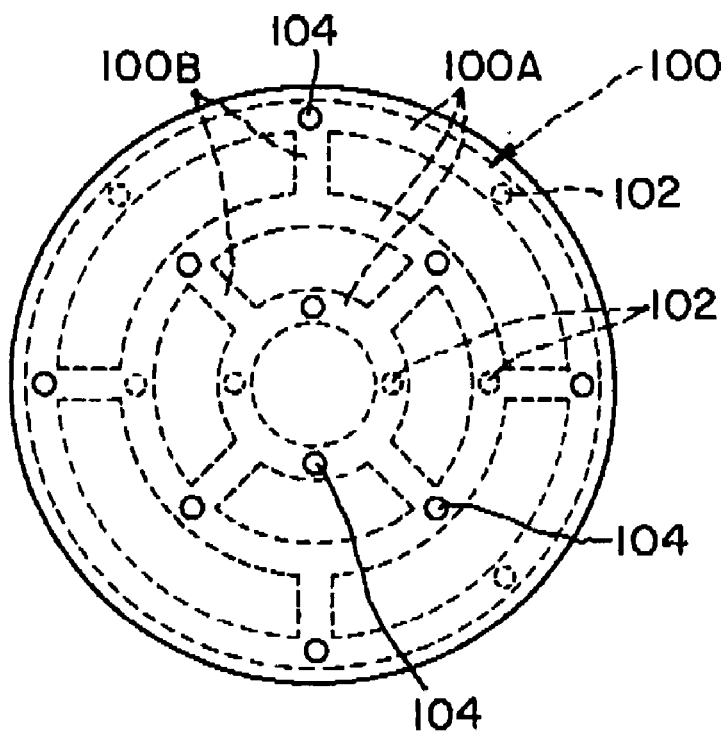
Figure 11:
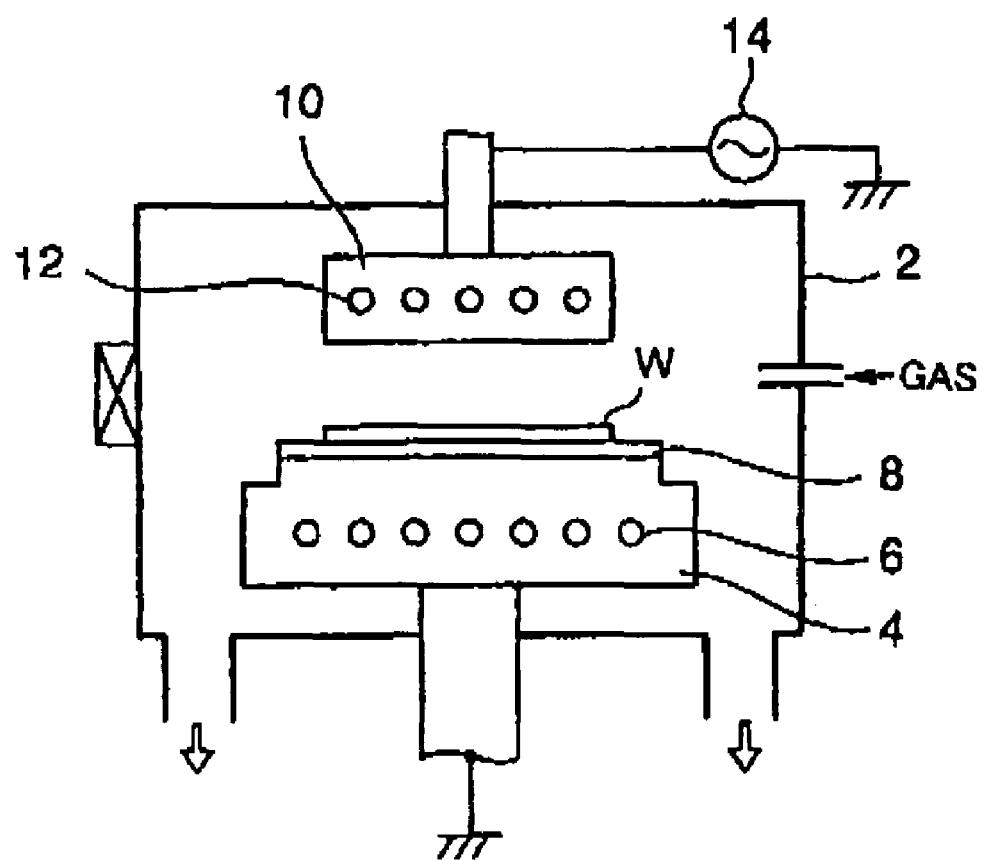
FIG. 11 is a schematic configurational view showing a conventional general plasma processing apparatus.

Moreover, as shown in FIGS. 10(*a*) and 10(*b*), the susceptor may be constituted such that a heat transfer gas can be supplied between the electrostatic chuck and the wafer. In this case, an upper ceramic-metal composite 40A, a lower ceramic-metal composite 40B, and a heater 38 are cast in aluminum, in the same manner as in the production of the susceptor 24 shown in FIG. 1.

Then, a diffusion chamber 100 is formed by machining in an upper surface of the upper ceramic-metal composite 40A. The diffusion chamber 100 is formed by combining a plurality of circumferential grooves disposed concentrically, and diametrical grooves communicating with the circumferential grooves, as shown in FIG. 10(*b*) (FIG. 10(*b*) is a plan view of the susceptor viewed from the direction of an arrow B in FIG. 10(*a*).

Then, heat transfer gas passages 102, each of which starts at the bottom of the groove of the diffusion chamber 100, passes through the susceptor body 26, and opens at a lower surface of the susceptor body 26, are formed by boring the susceptor body 26. The heat transfer gas passages 102 are provided while dodging the positions where the heater 38 is present.

Then, the electrostatic chuck 28 is brazed to the susceptor body 26. Then, heat transfer gas supply holes 104 are drilled at plural locations of the electrostatic chuck 28. Alternatively, the electrostatic chuck 28 having the heat transfer gas supply holes 104 preformed therein may be brazed to the susceptor body 26.

To perform treatment, such as film forming treatment, by a plasma processing apparatus to which the susceptor 24 shown in FIGS. 10(*a*) and 10(*b*) is applied, a heat transfer gas, such as an Ar gas or an He gas, is supplied from a gas supply source (not shown) to the lower end of the heat transfer gas passages 102. The heat transfer gas having passed through the heat transfer gas passages 102 enters the diffusion chamber 100, and is supplied toward the rear surface of the wafer via the heat transfer gas supply holes 104.

According to the embodiment shown in FIGS. 10(*a*) and 10(*b*), the heat transfer gas is uniformly supplied to the rear surface of the wafer, so that heat can be transferred from the susceptor 24 to the wafer uniformly and with high efficiency. Thus, the plane uniformity of the process can be improved.

Instead of the formation of the grooves in the upper surface of the upper ceramic-metal composite 40A, grooves may be formed in the lower surface of the electrostatic chuck 28 to form the diffusion chamber 100.

In the respective embodiments thus far explained, plasma CVD treatment, which performs film formation by plasma treatment, is taken as an example for illustration. However, this treatment is not restrictive, and the device of the present invention can, of course, be applied to sputtering, etching, or ashing.

Furthermore, the frequency for plasma generation is not limited to that described earlier. Nor is the object to be treated limited to a semiconductor wafer. An LCD substrate or a glass substrate can also be used.

What is claimed is:

1. An electrode comprising:
   a base metal formed of a cast metal;
   a heater embedded in the base metal and arranged on a plane; and
   a pair of core metal plates embedded in the base metal and arranged substantially parallel to the plane and adjacent to the heater, the core metal plates being arranged above and below the heater, respectively;
   wherein the heater and the core metal plates are cast in the base metal such that the core metal plates are entirely surrounded by the base metal and are entirely in metal-to-metal contact with the base metal;
   wherein a material forming the core metal plates has a rigidity higher than that of a material forming the base metal; and
   each of the core metal plates has a plurality of through holes, which are filled with the base metal so that the base metal above the respective core metal plates and the base metal below the respective core metal plates are bound together via the base metal filled in the through holes.

2. The electrode according to claim 1, wherein each of the through holes has a diameter ranging from about 0.1 mm to about 10 mm.

3. The electrode according to claim 1, wherein the core metal plates are made of stainless steel, and the base metal is made of aluminum.

4. The electrode according to claim 1, wherein the core metal plates have a thickness ranging from about 1 mm to about 2 mm.

5. The electrode according to claim 1, wherein the core metal plates are disk-shaped.

6. The electrode according to claim 1, wherein the material forming the core metal plates has a softening temperature higher than that of the material forming the base metal.

7. A plasma processing apparatus comprising:
   a processing vessel;
   the electrode as defined in claim 1; and
   a high frequency power source adapted to apply a high frequency voltage to the electrode.

* * * * *